United States Patent
Higashi

(10) Patent No.: US 8,610,199 B2
(45) Date of Patent: Dec. 17, 2013

(54) FABRICATING METHOD OF MIRROR BIT MEMORY DEVICE HAVING SPLIT ONO FILM WITH TOP OXIDE FILM FORMED BY OXIDATION PROCESS

(71) Applicant: Spansion LLC, Sunnyvale, CA (US)

(72) Inventor: Masahiko Higashi, Fukushima-Ken (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 13/776,310

(22) Filed: Feb. 25, 2013

(65) Prior Publication Data

US 2013/0175601 A1 Jul. 11, 2013

Related U.S. Application Data

(62) Division of application No. 12/266,512, filed on Nov. 6, 2008, now Pat. No. 8,404,549.

(51) Int. Cl.
*H01L 29/792* (2006.01)

(52) U.S. Cl.
USPC ............ 257/324; 257/E29.309; 257/E21.423; 438/288

(58) Field of Classification Search
USPC ........... 257/324, E29.309, E21.423; 438/287, 438/288
See application file for complete search history.

(56) References Cited

U.S. PATENT DOCUMENTS

| | | | |
|---|---|---|---|
| 5,511,020 A * | 4/1996 | Hu et al. | 365/185.28 |
| 5,877,523 A | 3/1999 | Liang et al. | |
| 6,114,723 A | 9/2000 | Leu | |
| 6,259,131 B1 | 7/2001 | Sung et al. | |
| 6,538,277 B2 | 3/2003 | Sung et al. | |
| 6,673,677 B2 | 1/2004 | Hofmann et al. | |
| 6,835,621 B2 | 12/2004 | Yoo et al. | |
| 7,005,349 B2 | 2/2006 | Lee et al. | |
| 7,324,374 B2 | 1/2008 | Shieh et al. | |
| 7,385,851 B1 | 6/2008 | Park et al. | |
| 7,511,334 B2 * | 3/2009 | Lee et al. | 257/324 |
| 7,638,835 B2 | 12/2009 | Irani et al. | |
| 7,829,404 B2 | 11/2010 | Klinger et al. | |
| 8,110,866 B2 | 2/2012 | Hong et al. | |
| 8,404,549 B2 | 3/2013 | Higashi | |
| 2001/0022375 A1 | 9/2001 | Hsieh et al. | |
| 2003/0141541 A1 * | 7/2003 | Wu | 257/319 |
| 2004/0183106 A1 * | 9/2004 | Kim et al. | 257/239 |
| 2004/0238874 A1 | 12/2004 | Chen et al. | |
| 2005/0164451 A1 * | 7/2005 | Ogura et al. | 438/257 |
| 2006/0035433 A1 | 2/2006 | Jung | |
| 2007/0200180 A1 | 8/2007 | Irani et al. | |

(Continued)

OTHER PUBLICATIONS

Dixit, B. B. et al., "Electrical and Structural Characteristics of Oxides Grown From Polycrystalline Silicon," Bull. Mater. Sci., Jun. 1986, 8(3): 307-313.

(Continued)

*Primary Examiner* — Allan R Wilson

(74) *Attorney, Agent, or Firm* — Sterne, Kessler, Goldstein & Fox P.L.L.C.

(57) ABSTRACT

A device and method employing a polyoxide-based charge trapping component. A charge trapping component is patterned by etching a layered stack that includes a tunneling layer positioned on a substrate, a charge trapping layer positioned on the tunneling layer, and an amorphous silicon layer positioned on the charge trapping layer. An oxidation process grows a gate oxide layer from the substrate and converts the amorphous silicon layer into a polyoxide layer.

11 Claims, 5 Drawing Sheets

(56) References Cited

U.S. PATENT DOCUMENTS

2008/0175054 A1 7/2008 Hancock et al.
2008/0268594 A1 10/2008 Kim
2013/0161728 A1 6/2013 Higashi

OTHER PUBLICATIONS

Li, Peng, Abstract of "Polyoxide as an Insulator for Silicon Carbide MOS Devices," Dissertation, University of Connecticut, Jan. 2005, http://digitalcommons.uconn.edu/dissertations/AAI3187738/ (accessed Sep. 19, 2008).
Final Rejection, mailed Jul. 22, 2013, for U.S. Appl. No. 13/776,337, filed Feb. 25, 2013, 5 pages.
Non-Final Rejection, mailed May 7, 2013, for U.S. Appl. No. 13/776,337, filed Feb. 25, 2013: 8 pages.
Notice of Allowance, mailed Jan. 22, 2013, for U.S. Appl. No. 12/266,513, filed Nov. 6, 2008; 5 pages.
Non-Final Rejection, mailed Jun. 11, 2012, for U.S. Appl. No. 12/266,512, filed Nov. 6, 2008; 8 pages.
Non-Final Rejection, mailed Nov. 22, 2010, for U.S. Appl. No. 12/266,512, filoed Nov. 6, 2008; 7 pages.
Final Rejection, mailed Nov. 9, 2012, for U.S. Appl. No. 12/266,512, filed Nov. 6, 2008; 9 pages.
Final Rejection, mailed May 25, 2011, for U.S. Appl. No. 12/266,512, filed Nov. 6, 2008; 9 pages.
Final Rejection, mailed Mar. 14, 2011, for U.S. Appl. No. 12/266,512, filed Nov. 6, 2008; 7 pages.

* cited by examiner

FABRICATING METHOD OF MIRROR BIT MEMORY DEVICE HAVING SPLIT ONO FILM WITH TOP OXIDE FILM FORMED BY OXIDATION PROCESS

CROSS-REFERENCE TO RELATED APPLICATIONS

Utility Patent Application is a Divisional of U.S. patent application Ser. No. 12/266,512 filed on Nov. 6, 2008, now U.S. Pat No. 8,404,549 entitled "Fabricating Method of Mirror Bit Memory Device Having Split ONO Film With Top Oxide Film Formed by Oxidation Process," the benefit of which is hereby claimed under 35 U.S.C.§120 and further incorporated herein by reference in its entirety.

FIELD OF THE INVENTION

The invention is related to microelectronic devices employed in a memory, and in particular but not exclusively, to a charge trapping component of a memory cell.

BACKGROUND OF THE INVENTION

A memory, such as a random access memory (RAM) or read only memory (ROM) often includes arrayed memory cells. Typically, each of the memory cells is coupled to at least one bit line and an overlapping word line, and each of the memory cells include a memory element that is configured to store a logic state. In operation, a system controller reads from and/or writes to an individual memory element by receiving and transmitting signals over the bit and word lines of the memory.

Flash-based memories employ memory cells having charge trapping components for storing one or more logic states. In one example, a charge trapping component includes a silicon nitride layer positioned between a thermally grown (or deposited) silicon oxide layer and another deposited oxide layer. Such a charge trapping component is often referred to as an oxide-nitride-oxide (ONO) stack. A memory cell that includes an ONO stack between a silicon substrate and a silicon word line is often referred to as a silicon-oxide-nitride-oxide-silicon (SONOS) cell.

BRIEF DESCRIPTION OF THE DRAWINGS

Non-limiting and non-exhaustive embodiments of the present invention are described with reference to the following drawings, in which.

DETAILED DESCRIPTION

Figure 1:
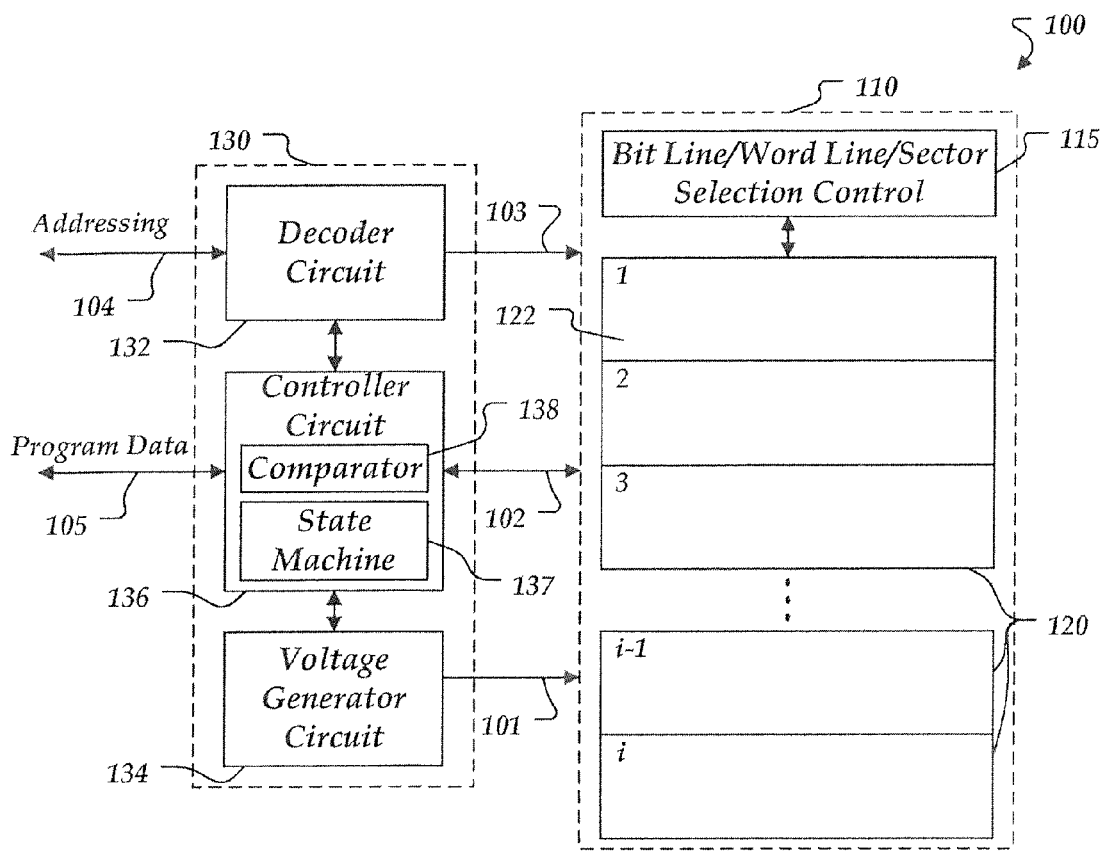
FIG. 1 is a block diagram of an embodiment of a memory controller and an arrayed memory.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take the meanings explicitly associated herein, unless the context clearly dictates otherwise. The phrase "in one embodiment" as used herein does not necessarily refer to the same embodiment, though it may. Furthermore, the phrase "in another embodiment" as used herein does not necessarily refer to a different embodiment, although it may. Thus, as described below, various embodiments of the invention may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

Briefly stated, the invention is related to a device and method employing a polyoxide-based charge trapping component. A charge trapping component is patterned by etching a layered stack that includes a tunneling layer positioned on a substrate, a charge trapping layer positioned on the tunneling layer, and an amorphous silicon layer positioned on the charge trapping layer. An oxidation process grows a gate oxide layer from the substrate and converts the amorphous silicon layer into a polyoxide layer. In one embodiment the amorphous silicon layer includes a polysilicon layer. In another embodiment, the polyoxide-based charge trapping component is employed in a dual-bit memory cell. In yet another embodiment, the tunneling layer includes a silicon oxide film and the charge trapping layer includes a silicon nitride film.

FIG. 1 shows a memory environment in which embodiments of the invention may be employed. Not all the components illustrated in the figures may be required to practice the invention, and variations in the arrangement and type of the components may be made without departing from the spirit or scope of the invention. For example, although primarily discussed in the context of a flash-based memory having dual-bit memory cells, other types of memory and/or configurations of memory cells are possible. For example, polyoxide-based charge trapping components may be employed in single-bit memory cells or other types of multi-bit memory cells.

As shown, memory 100 includes arrayed memory 110 and memory controller 130. Arrayed memory 110 is arranged to receive and/or transmit signals over signal/bus lines 101-103. Arrayed memory 110 includes bit line/word line/sector control circuit 115 and memory sectors 120 (identified individually as sectors 1-i). Memory sectors 120 can include, for example, 256, 512, 1024, or more sectors having memory cells that can be individually or collectively accessed via bit line/word line/sector control circuit 115. In other examples, the number and/or arrangement of memory sectors can be different. In one embodiment, for example, sectors 120 can be referred to more generally as memory blocks, and bit line/ word line/sector control circuit 115 can be configured to have a configuration that is different than a bit line, word line, and/or sector topology.

Memory controller 130 includes decoder circuit 132, voltage generator circuit 134, and controller circuit 136. In one embodiment, memory controller 130 may be located on the same chip as arrayed memory 110. In another embodiment, memory controller 110 may be located on a different chip, or portions of memory controller 110 may be located on another chip or off chip. For example, decoder circuit 132, voltage generator circuit 134, and controller circuit 136 can be located on different chips but co-located on the same circuit board. In other examples, other implementations of memory controller 130 are possible. For example, memory controller 130 can include a programmable microcontroller.

Decoder circuit 132 is arranged to receive memory addresses via addressing signal/bus line 104 and to select individual sectors, arrays, or cells according to the architecture of arrayed memory 110. For example, in a RAM-based architecture, decoder circuit 132 can be configured to select memory cells individually or collectively from a sector for read/write access. Alternatively, in a ROM-based memory architecture, decoder circuit 132 might not select memory cells individually but can provide read/write access to entire cell arrays (or pages) of memory cells.

Decoder circuit 132 includes, for example, multiplexer circuits, amplifier circuits, combinational logic, or the like for selecting sectors, arrays, and/or cells based on any of a variety of addressing schemes. For example, a portion of a memory address (or a grouping of bits) can identify a sector within arrayed memory 110 and another portion (or another grouping of bits) can identify a core cell array within a particular sector.

Voltage generator circuit 134 is arranged to receive one or more supply voltages (not shown) and to provide a variety of reference voltages required for reading, writing, erasing, pre-programming, soft programming, and/or under-erase verifying operations. Controller circuit 136 is configured to control the voltages provided by voltage generator circuit 134. For example, voltage generator circuit 134 can include one or more amplifier circuits, regulator circuits, and/or switch circuits that can be controlled by controller circuit 136.

Controller circuit 136 is arranged to receive and transmit data from an upstream system controller (not shown). Such a system controller can include, for example, a processor and a static random access memory (SRAM) that can be loaded with executable processor instructions for communicating program data over signal/bus line 104 and addressing data over signal/bus line 105. In some embodiments, controller circuit 136 as well as other portions of memory controller 130 may be embedded or otherwise incorporated into a system controller or a portion of a system controller.

Controller circuit 136 includes state machine 137 and comparator component 138. State machine 137 can include any of a variety of circuits for invoking any of a myriad of algorithms for reading, writing, erasing, pre-programming, soft programming, and/or under-erase verifying operations of the memory 100.

Comparator component 138 can include, for example, comparator circuits, amplifier circuits, combination logic, or the like for providing an output signal by comparing signals received from arrayed memory 110 and/or from voltage generator circuit 134. In one embodiment, comparator component 138 is arranged to compare voltage signals. In another embodiment, comparator component 138 is arranged to compare current signals.

Figure 2:
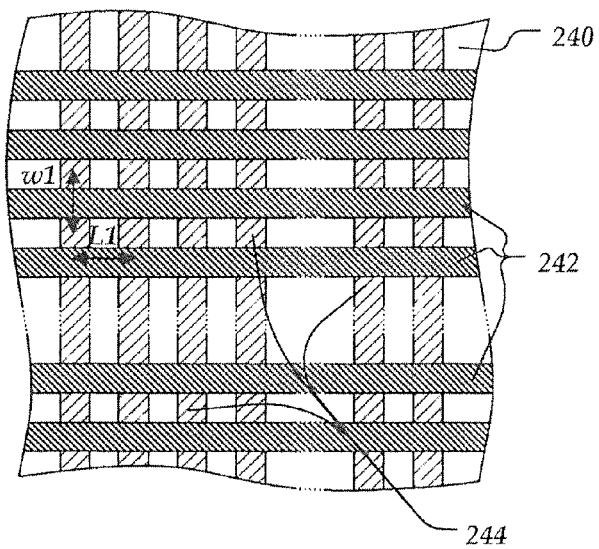
FIG. 2 is a partial top plan view of an embodiment of a memory sector that may be employed in the arrayed memory of FIG. 1.

FIG. 2 shows a partial top plan view of a sector that may be employed as an embodiment of sector 120 of FIG. 1. Sector 220 includes word lines 242, conductive regions 244, and a portion of substrate 240. Portions of conductive regions 244 can include, for example, p-type and/or n-type doped regions of substrate 240 for forming source/drain regions and/or conductive lines. Also, in some embodiments, individual conductive regions 244 extend underneath individual word lines 242.

In many embodiments, individual word lines 242 are polysilicon, and conductive regions 244 form portions of bit lines and/or common source lines. In general, portions of word lines 242 are coupled to the gates of individual memory cells (not shown in FIG. 2). In some embodiments, individual memory cells have common source/drain regions located at individual conductive regions 244. In one embodiment, individual memory cells are arranged in a NOR topology and can be individually accessed via individual conductive regions 244. In one embodiment, individual memory cells are arranged in a NAND topology and can be accessed though individual conductive regions 244 collectively but not individually. In other embodiments, hybrid architectures can be employed. For example, a sector can be configured to have a portion that is NAND-based and another portion that is NOR-based. In general, the pitch (or spacing) associated with word lines 242 and conductive regions 244 depend on the architecture of sector 220. For example, a NAND-based architecture generally has a smaller pitch than a NOR-based architecture.

Figure 3:
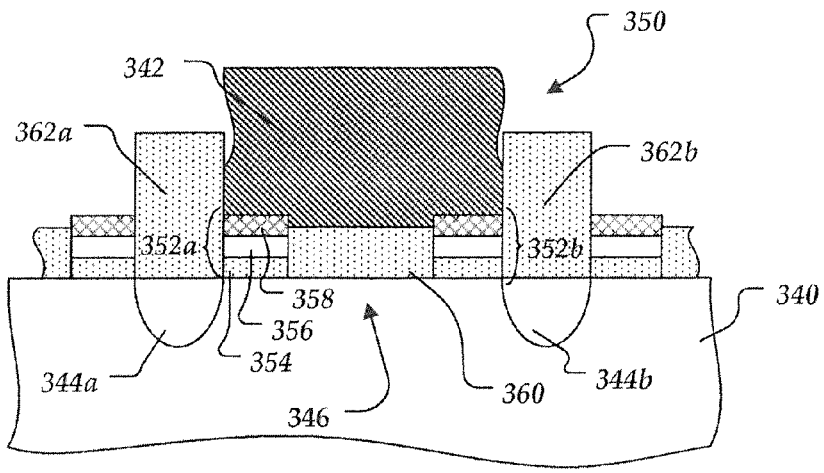
FIG. 3 is a cross-sectional side view of an embodiment of a memory cell that may be employed in an embodiment of the memory sector of FIG. 2.

FIG. 3 shows a cross-sectional side view of a memory cell that may be employed in an embodiment of sector 220 of FIG. 2, and which employs an embodiment of a polyoxide-based charge trapping component.

Memory cell 350 includes polyoxide-based charge trapping component 352 (identified by individual charge trapping elements 352a and 352b), gate oxide layer 360 positioned between charge trapping elements 352a and 352b, and isolation dielectrics 362a and 362b adjacent to charge trapping elements 352a and 352b, respectively. Memory cell 350 also includes a channel region 346 located in a portion of substrate 340, source/drain regions 344a and 344b located in another portion of substrate 340, and a portion of word line 342. Substrate 340 may be an embodiment of substrate 240 of FIG. 2. Source/drain regions 344a and 344b may be an embodiment of one or more conductive regions 244 of FIG. 2. Word line 342 may be an embodiment of an individual word line 242 of FIG. 2.

In operation, a charge trapping element is "programmed" when it is trapping a charge and "unprogrammed" when it is not trapping charge. In general, charge trapping element 352a can be referred to as a normal bit (NB) of memory cell 350 and charge trapping element 352b can be referred to as a complimentary bit (CB) of memory cell 350 (or vice versa). Although generally described in the context of a dual-bit topology, other embodiments of charge trapping elements can store multiple logic (or bit) states. For example, one discrete amount of charge can indicate one logic state, and a larger or smaller amount of charge can indicate another logic state.

To read from charge trapping elements 352a and 352b, a voltage is applied to word line 342, another voltage is applied across source/drain regions 344a and 344b, and the current is measured to detect threshold voltages associated with charge trapping elements 352a and/or 352b. In general, memory cell 350 has distinct IV characteristics, or turn-on behavior, for each combination of programmed and/or unprogrammed states of charge trapping elements 352a and 352b.

To write to charge trapping elements 352a and 352b (either separately or collectively), a voltage is applied to word line 342 and another voltage is applied to at least one of charge elements 352a and 352b. In addition or alternatively, at least one of charge elements 352a and 352b can be grounded or floated. Also, in some embodiments, the body region of memory cell 350 can also be biased, grounded, or floated. In one embodiment, hot electron injection can be employed to inject or remove charge individually from charge trapping elements 352a and 352b. In another embodiment, Fowler-Nordheim tunneling can be employed to inject or remove charge individually from charge trapping elements 352a and 352b.

To trap charge at charge trapping elements 352a and 352b, charge trapping component 30 352 employs tunneling layer 354, charge trapping layer 356 positioned on tunneling layer 354, and polyoxide layer 358 positioned on charge trapping layer 356. In general, tunneling layer 354 provides a tunneling barrier, charge trapping layer 356 is a non-conductive layer that stores a tunneled charge, and polyoxide layer 358 electrically isolates charge trapping layer 356 from word line 342.

In contrast to conventional charge trapping structures, charge trapping component 352 employs a polyoxide layer for electrical isolation. Conventional charge trapping structures, on the other hand, provide electrical isolation through a conventional silicon oxide film, such as a conventional thermally, chemically, and/or physically deposited silicon oxide film.

Polyoxide layers or the like are structurally different than conventional silicon oxide films. Although described in the context of a polyoxide that is grown from a polysilicon layer, the term polyoxide as used herein can refer more generally to an oxide that is grown from an amorphous silicon layer or film. In general, a polyoxide typically has structural properties that are a function of the surface morphology of the original polysilicon (or amorphous silicon) from which it was grown. For example, breakdown voltage of a polyoxide can be a function of polysilicon roughness. Also, the dielectric properties of poly oxides differ from those of conventional silicon oxides. For example, grain boundaries in polyoxide can enhance localized electric fields. As a result, polyoxide layers can be more conductive relative than conventional silicon oxides.

Although in some embodiments such structural properties could be less desirable, a robust manufacturing process can be achieved by employing a polyoxide in lieu of a conventional silicon oxide. For example, in one embodiment, the original polysilicon layer (from which a polyoxide is grown) reduces the extent to which isolation dielectrics 362a and 362b are etched during manufacturing (see, e.g., FIG. 9). This, in turn, maintains a high breakdown voltage across isolation dielectrics 362a and 362b. Further, in some embodiments, the structural properties of a polyoxide can be enhanced, such as by increasing the density of a polyoxide and/or by providing smooth grain boundary transitions.

Figure 4:
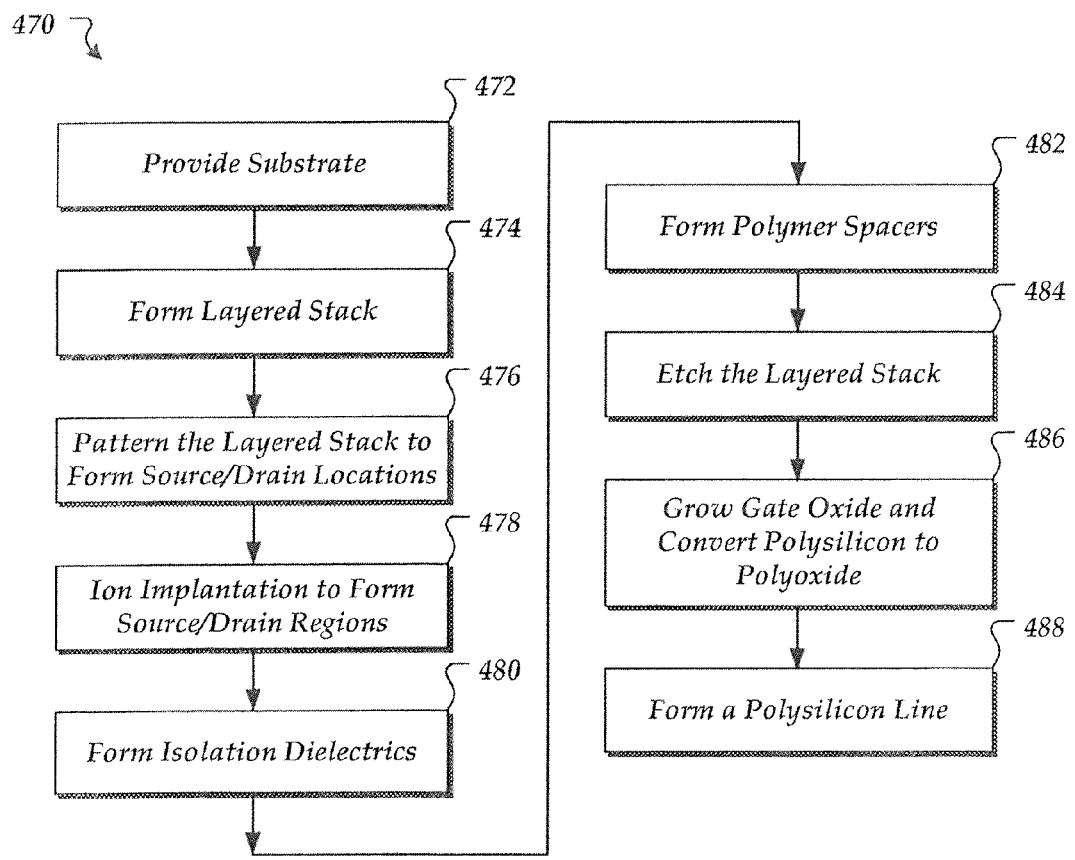
FIG. 4 is a processing flow diagram generally showing one embodiment of a process for manufacturing a polyoxide-based charge trapping component.

FIG. 4 is a processing flow diagram generally showing one embodiment of process 470 for manufacturing a polyoxide-based charge trapping component. In one embodiment, process 470 is employed to form charge trapping component 352 of FIG. 3. The invention, however, is not so limited, and at least a portion of process 470 may be employed to form other embodiments of charge trapping components and/or memory cells.

Process 470 begins at block 472, where a substrate is provided. A substrate can include any of a wide variety of supporting materials in which microelectronic devices and other structures of a memory may be formed. In general, a substrate includes one or more semiconductor materials, such as a group IV semiconductor material or compound semiconductor materials. Group IV materials include, for example, silicon, germanium, or the like. Compound semiconductor materials include, for example, Gallium Arsenide, Indium Phosphide, or the like. Although primarily discussed in the context of silicon-based semiconductor processing, other embodiments of substrates may be employed.

Also, in many embodiments, a substrate can be pre-processed prior to block 472. In one embodiment, a substrate may include pre-existing features for forming memory cells or other devices in the substrates, such as transistors, capacitors, resistors, or the like. For example, a substrate may include an implanted region for providing a channel region in a memory cell. Processing continues to block 474, where a layered stack is formed. The layered stack includes a tunneling layer, a charge trapping layer, and a polysilicon layer. In general, any of a wide variety of thermal and/or thin film deposition processes may be employed to form each layer of the layered stack. Thermal deposition processes can include, for example, wet and/or dry thermal oxidation process. Thin film deposition processes can include, for example, chemical vapor deposition (CVD), physical vapor deposition (PVD), plasma enhanced CVD (PECVD), atomic layer deposition (ALD), or the like. In one embodiment, the tunneling layer is formed by growing or depositing a silicon oxide. In one embodiment, the charge trapping layer is formed by depositing a non-conductive semiconductor layer on the tunneling layer. For example, a stochiometric silicon nitride or a silicon rich silicon nitride can be deposited on the tunneling layer. In one embodiment, the polysilcon layer is formed by depositing doped or undoped polysilicon on the charge trapping layer.

Processing continues to block 476, where the layered stack undergoes one or more patterning processes to define the locations of source/drain regions. In general, patterning processes can include any of a wide variety of combinations of photolithographic and etching processes. Photolithographic process can include, for example, single- or multi-step semiconductor materials. Group IV materials include, for example, silicon, germanium, or the like. Compound semiconductor materials include, for example, Gallium Arsenide, Indium Phosphide, or the like. Although primarily discussed in the context of silicon-based semiconductor processing, other embodiments of substrates may be employed.

Also, in many embodiments, a substrate can be pre-processed prior to block 472. In one embodiment, a substrate may include pre-existing features for forming memory cells or other devices in the substrates, such as transistors, capacitors, resistors, or the like. For example, a substrate may include an implanted region for providing a channel region in a memory cell. Processing continues to block 474, where a layered stack is formed. The layered stack includes a tunneling layer, a charge trapping layer, and a polysilicon layer. In general, any of a wide variety of thermal and/or thin film deposition processes may be employed to form each layer of the layered stack. Thermal deposition processes can include, for example, wet and/or dry thermal oxidation process. Thin film deposition processes can include, for example, chemical vapor deposition (CVD), physical vapor deposition (PVD), plasma enhanced CVD (PECVD), atomic layer deposition (ALD), or the like. In one embodiment, the tunneling layer is formed by growing or depositing a silicon oxide. In one embodiment, the charge trapping layer is formed by depositing a non-conductive semiconductor layer on the tunneling layer. For example, a stochiometric silicon nitride or a silicon rich silicon nitride can be deposited on the tunneling layer. In one embodiment, the polysilcon layer is formed by depositing doped or undoped polysilicon on the charge trapping layer.

Processing continues to block 476, where the layered stack undergoes one or more patterning processes to define the locations of source/drain regions. In general, patterning processes can include any of a wide variety of combinations of photolithographic and etching processes. Photolithographic process can include, for example, single- or multi-step photolithographic techniques employing one or more photoresist masks, such as a photolithographic mask including UV or deep UV light sensitive materials and optionally back anti-reflective coatings (BARC). Etching processes can include, for example, one or more wet and/or dry etch techniques to etch through a photoresist mask and create patterned features in an underlying layer or substrate, including chemical and/or physical etching techniques, employing, for example, isotropic or anisotropic wet and/or dry etch chemistries, reactive ion etches, and/or plasma assisted etches. Also, in some embodiments, a photoresist mask layer can also be employed in combination with a "hard" mask, such as a silicon nitride hard mask. In another embodiment the thickness of the "hard" mask may correspond to a characteristic of the breakdown voltage of the memory device.

Processing continues to block 478, where source/drain regions are formed by an ion implantation process. An ion implantation process may achieve a desired impurity concentration in the source/drain regions by employing various doses of implant species to open areas of the substrate through the etched layered stack. Source/drains that are n-type, for example, can be formed by n-type implant species, such as phosphorous (P), arsenic (As), or antimony (Sb). Source/drains that are p-type, for example, can be formed by p-type implant species, such as boron (B) or aluminum (Al). Also, an ion implantation process may employ various implantation energies to achieve a desired depth of implant species. Further, an ion implantation process can be employed in combination with a thermal diffusion process.

Processing continues to block 480, where isolation dielectrics are formed adjacent to the source/drain regions by a thin film deposition process. In one embodiment, the isolation dielectrics include a high density plasma (HDP) oxide. In another embodiment, the isolation dielectrics include a tetra-ethyl-ortho-silicate (TEOS) oxide or an ozone based TEOS. In one embodiment, a chemical mechanical polishing (CMP) process can planarize the isolation dielectrics. In another embodiment, a patterning process can pattern the isolation dielectrics.

Processing continue to block 482, where polymer spacers are formed to define the locations of the charge trapping elements and the gate oxide layer. A polymer layer is formed on the layered stack and a blanket etching process is then employed to form polymer spacers adjacent to the isolation dielectrics. The polymer spacers can include, but are not limited to, a hydrocarbon based polymer material or the like. In one embodiment, a plasma-based system can be employed to first deposit a polymer layer and then etch back the polymer layer by changing the chamber process/chemistry.

Processing continues to block 484, where portions of the layered stack not covered by the polymer spacers are etched. The etching process etches through each layer of the layered stack. In a first etch process to etch the polysilicon layer, the etching process is selective to the polysilicon layer over the isolation dielectrics. In a second etch process to etch the charge trapping layer, the first process step is continued or another etching process is employed that is selective to the charge trapping layer over the isolation dielectrics. In a third etch process to etch the tunneling layer, an etching process etches the tunneling layer until the surface of the substrate is exposed through the non-etched portion of the layered stack.

In many embodiments, the third etch process is less selective over the isolation dielectrics. Thus, to conserve the height of the isolation dielectrics, the etch time of the third etch may generally be no longer than what is required to expose the surface of the substrate.

Processing continues to block 486, where an oxidation process grows the gate oxide layer from the exposed portions of the substrate formed at block 484. Also, at this same time, the polysilicon layer begins converting into a polyoxide via the oxidation process. In one embodiment, the oxidation process employs dry oxidation. In another embodiment, the oxidation process employs thermal wet oxidation.

The oxidation process at block 486 may continue until the polysilicon layer is fully converted into a polyoxide layer. In one embodiment, the oxidation process continues until the polyoxide layer interfaces with the charge trapping layer. In another embodiment, the oxidation process continues for a time that ensures that the polysilicon layer is fully consumed. For example, the oxidation time can be tailored to account for polysilicon non-uniformity across a microelectronic wafer. In some embodiments, the temperature of the oxidation process may be tailored. For example, the temperature can be configured to enhance the midgrain regions and/or the grain boundaries of the polyoxide and/or to provide a smooth polyoxide/charge trapping layer interface to decrease charge leakage.

Processing is completed at block 488, where a word line is formed by a deposition process and a subsequent patterning process. In one embodiment, the word line can be formed such that it extends over the isolation dielectrics. In another embodiment, the word line can be patterned so that another material can be deposited over the isolation dielectrics.

FIGS. 5-10 illustrate various embodiments of stages corresponding to the manufacture of a polyoxide-based charge trapping element. In one embodiment, the various stages employ the process flow described with reference to FIG. 4. In another embodiment, the various stages employ additional or alternative steps.

Figure 5:
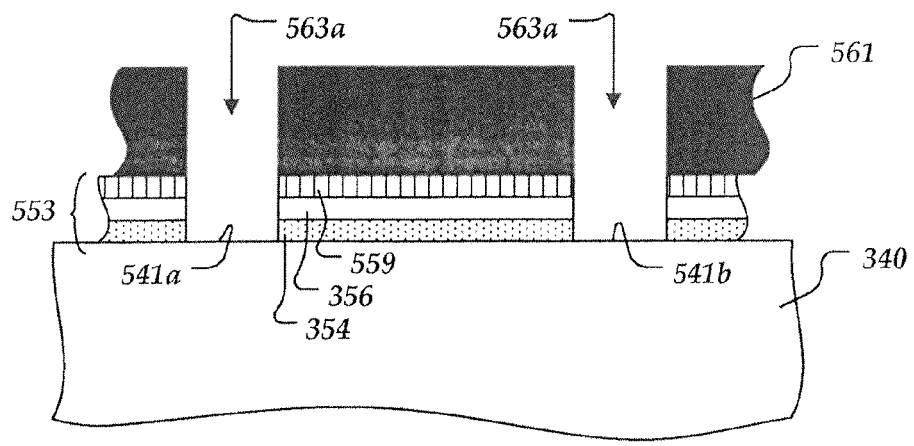
FIGS. 5-10 illustrate embodiments of stages corresponding to the manufacture of a polyoxide-based charge trapping element.

FIG. 5 is an embodiment showing a cross-sectional side view of hard mask 561 having trenches 563a and 563b for patterning layered stack 553 and exposing surface portions 541a and 541b of substrate 340. Layered stack 553 includes polysilicon layer 559, charge trapping layer 356, and tunneling layer 354. In one embodiment, hard mask 561 can include a silicon nitride hard mask. In another embodiment, the cross-sectional side view of FIG. 5 corresponds to processing that has completed block 476 of process 470 of FIG. 4.

Figure 6:
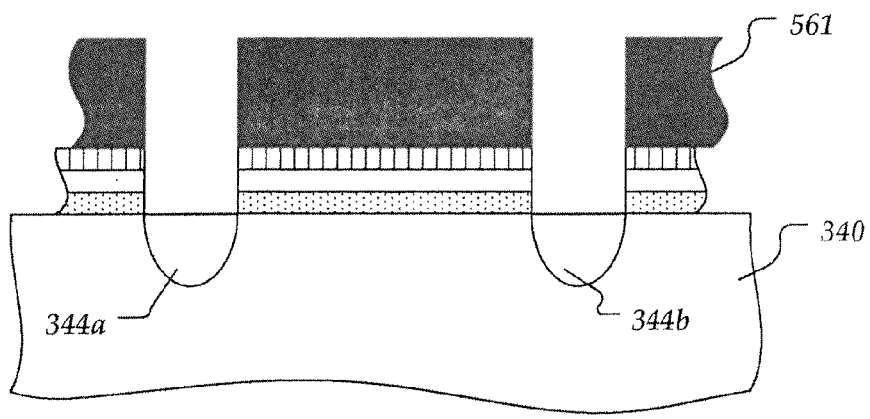

FIG. 6 is an embodiment showing a cross-sectional side view of source/drain regions 344a and 344b formed in substrate 340 by ion implantation through hard mask 561. In one embodiment, the cross-sectional side view of FIG. 6 corresponds to processing that has completed block 478 of process 470 of FIG. 4.

Figure 7:
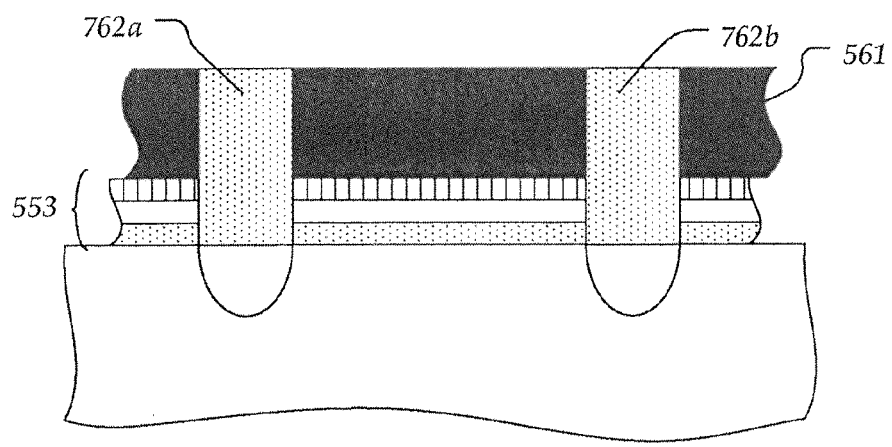

FIG. 7 is an embodiment showing a cross-sectional side view of isolation dielectrics 762a and 762b formed trenches defined by layered stack 553 and hard mask 561. In one embodiment, the cross-sectional side view of FIG. 7 corresponds to processing that has completed block 480 of process 470 of FIG. 4.

Figure 8:
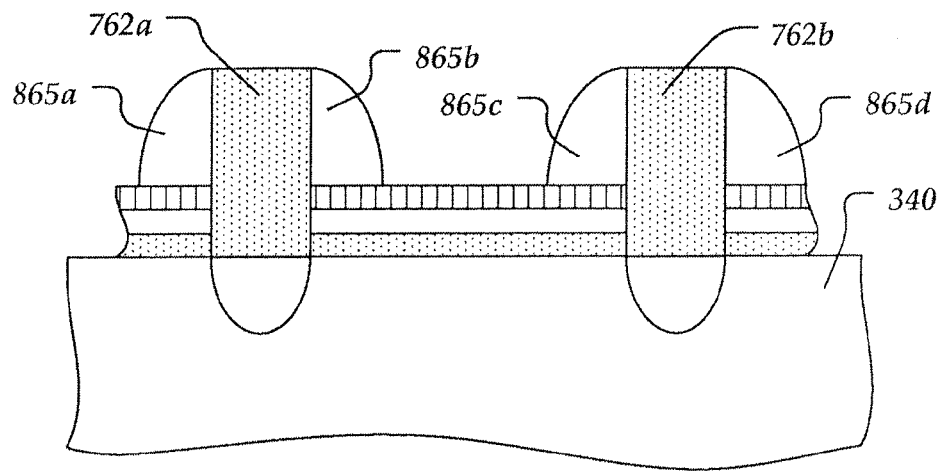

FIG. 8 is an embodiment showing a cross-sectional side view after hard mask 561 has been removed and polymer spacers 865a-d are formed adjacent to isolation dielectrics 762a and 762b. In one embodiment, the cross-sectional side view of FIG. 8 corresponds to processing that has completed block 482 of process 470 of FIG. 4.

Figure 9:
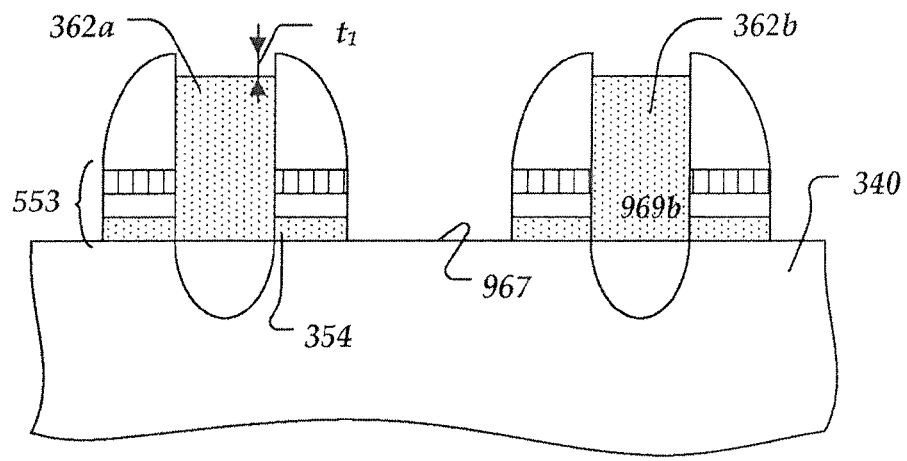

FIG. 9 is an embodiment showing a cross-sectional side view after layered stack 553 has been etched to surface portion 967 of substrate 340. In one embodiment, an etching process employed to etch tunneling layer 354 can etch isolation dielectrics 762a and 762b by thickness t1, defining the overall height of isolation dielectrics 362a and 362b. In another embodiment, the cross-sectional side view of FIG. 9 corresponds to processing that has completed block 484 of process 470 of FIG. 4.

Figure 10:
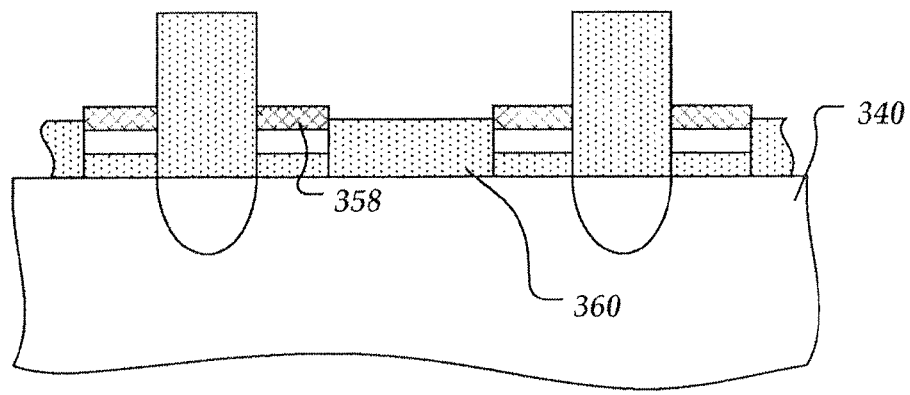

FIG. 10 is an embodiment showing a cross-sectional side view after gate oxide layer 360 has been grown from substrate 340 and polysilicon layer 559 has been converted into polyoxide layer 358. In one embodiment, polyoxide layer 358 can have thickness t2 based on an expansion that occurs during the oxidation process of the gate oxide layer 360. In another embodiment, the cross-sectional side view of FIG. 10 corresponds to processing that has completed block 486 of process 470 of FIG. 4.

Although not illustrated, processing may continue. For example, processing can complete block 488 of process 470 of FIG. 4. In addition, substrate 340 may eventually be cleaved or cut in various manners to form individual dies or chips that may be incorporated into a packaged device or other device.

Figure 11:
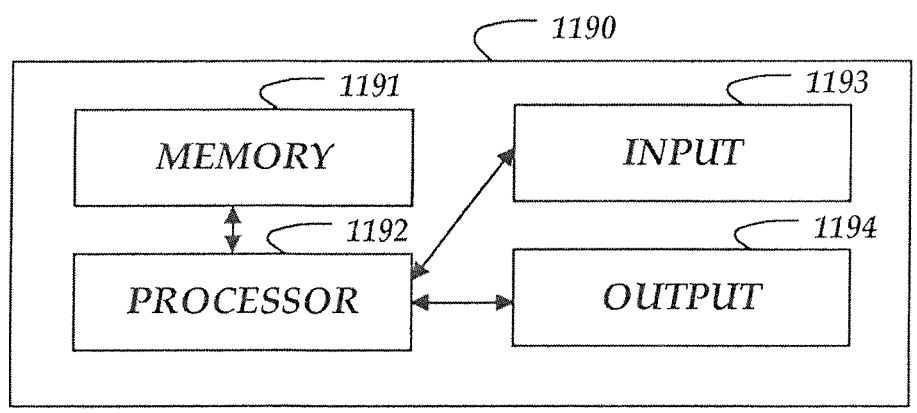
FIG. 11 is a block diagram of a system that may incorporate embodiments of poly-oxide based charge trapping components in memory cells or and/or other electronic devices, components, or circuits.

Embodiments of polyoxide based charge trapping components can be incorporated into any of a variety of components and/or systems, including for example, a processor and other components or systems of such components. FIG. 11 shows one embodiment of a system (1190) that may incorporate polyoxide-based charge trapping component and/or memory employing polyoxide-based charge trapping components in memory 1191. Memory 1191 may include, for example, anyone of the aforementioned memories, such as single-bit, dual-bit, or multi-bit flash memory. Memory 1191 can be directly or indirectly to anyone of processor 1192, input devices 1193, and/or output devices 1194. In one embodiment, memory 1191 may be configured such that it is removable from system 1190. In another embodiment, memory 1191 may be permanently connected to the components or a portion of the components of the system 1190. In many embodiments, memory 1191, processor 1192, input devices 1193, and/or output devices 1194 of system 1190 are configured in combination to function as part of a larger system. For example, system 1190 may be incorporated into a cell phone, a handheld device, a laptop computer, a personal computer, and/or a server device. In addition or alternatively, system 1190 can perform any of variety of processing, controller, and/or data storage functions, such as those associated with sensing, imaging, computing, or other functions. Accordingly, system 1190 can be incorporated into any of wide variety of devices that may employ such functions (e.g., a digital camera, an MP3 player, a GPS unit, and so on).

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A microelectronic device, comprising:
   a substrate;
   an isolation dielectric that is positioned on a first portion of the substrate;
   a gate oxide layer; and
   a charge trapping element that is positioned between the isolation dielectric and the gate oxide layer, wherein the charge trapping element includes a tunneling layer, a charge trapping layer positioned on the tunneling layer, and a polyoxide layer positioned directly on the charge trapping layer.

2. The microelectronic device of claim 1, wherein the tunneling layer includes a silicon dioxide material, and wherein the charge trapping layer includes a silicon nitride material.

3. The microelectronic device of claim 1, further comprising at least one of a single bit memory cell or a multi-bit memory cell that includes, at least, the charge trapping element.

4. The microelectronic device of claim 1, further comprising a dual bit memory cell that includes, at least, the charge trapping element.

5. The microelectronic device of claim 1, wherein the polyoxide layer includes oxidized polysilicon.

6. The microelectronic device of claim 1, further comprising a word line for at least one of receiving a charge or discharging a charge.

7. A memory, comprising
   a word line; and
   a memory cell, comprising:
      a portion of the word line; and
      a charge trapping component coupled to the portion of the word line,
      wherein the charge trapping component includes a charge trapping layer and a polyoxide layer directly on the charged trapping layer that is configured to electrically isolate the charge trapping component.

8. The memory of claim 7, further comprising a memory controller coupled to the memory cell via the word line and configured to provide read/write access to the memory cell.

9. The memory of claim 7, wherein the memory cell further includes:
   a first isolation dielectric; and
   a second isolation dielectric, wherein the charge trapping component is positioned between the first isolation dielectric and the second isolation dielectric.

10. The memory of claim 7, wherein the polyoxide layer includes oxidized polysilicon.

11. The memory of claim 7, further comprising a dual bit memory cell that includes, at least, the charge trapping component.

* * * * *

UNITED STATES PATENT AND TRADEMARK OFFICE
CERTIFICATE OF CORRECTION

PATENT NO. : 8,610,199 B2
APPLICATION NO. : 13/776310
DATED : December 17, 2013
INVENTOR(S) : Masahiko Higashi Page 1 of 1

It is certified that error appears in the above-identified patent and that said Letters Patent is hereby corrected as shown below:

In the Specification:

Column 1, line 9, "Utility Patent Application" should read --This Utility Patent Application--.

In the Claims:

Claim 7, column 10, line 38, "on the charged trapping" should read --on the charge trapping--.

Signed and Sealed this
Twentieth Day of May, 2014

Michelle K. Lee
*Deputy Director of the United States Patent and Trademark Office*